(12) United States Patent
Ruan et al.

(10) Patent No.: US 10,090,212 B2
(45) Date of Patent: Oct. 2, 2018

(54) EVAPORATION METHOD INCLUDING STRETCHING A FLEXIBLE SUBSTRATE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Shixin Ruan, Beijing (CN); Fuyi Cui, Beijing (CN); Xuefei Bai, Beijing (CN); Fashun Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 85 days.

(21) Appl. No.: 15/147,257

(22) Filed: May 5, 2016

(65) Prior Publication Data

US 2017/0033285 A1     Feb. 2, 2017

(30) Foreign Application Priority Data

Jul. 30, 2015   (CN) .......................... 2015 1 0461399

(51) Int. Cl.
| | |
|---|---|
| H01L 21/00 | (2006.01) |
| H01L 21/20 | (2006.01) |
| H01L 21/44 | (2006.01) |
| H01L 21/66 | (2006.01) |
| H01L 51/56 | (2006.01) |
| H01L 51/00 | (2006.01) |
| C23C 14/04 | (2006.01) |

(52) U.S. Cl.
CPC ............ *H01L 22/26* (2013.01); *C23C 14/042* (2013.01); *H01L 51/0011* (2013.01); *H01L 51/0097* (2013.01); *H01L 51/56* (2013.01); *H01L 2251/5338* (2013.01); *Y02E 10/549* (2013.01)

(58) Field of Classification Search
CPC ........... C23C 14/042; H01L 2251/5338; H01L 22/26; H01L 51/0011; H01L 51/0097; H01L 51/56; Y02E 10/549
USPC .............................................. 438/5, 584, 679
See application file for complete search history.

(56) References Cited

U.S. PATENT DOCUMENTS

| | | | |
|---|---|---|---|
| 2003/0124764 A1* | 7/2003 | Yamazaki ................ | B05D 1/60 |
| | | | 438/99 |
| 2005/0130422 A1* | 6/2005 | Theiss ................... | C23C 14/042 |
| | | | 438/689 |
| 2016/0184854 A1* | 6/2016 | Pan ........................ | B32B 3/266 |
| | | | 118/504 |

FOREIGN PATENT DOCUMENTS

| | | |
|---|---|---|
| CN | 102169960 A | 8/2011 |
| CN | 103713436 A | 4/2014 |
| CN | 103839864 A | 6/2014 |

OTHER PUBLICATIONS

First Chinese Office Action dated Mar. 29, 2017; Appln. No. 201510461399.8.

* cited by examiner

*Primary Examiner* — Duy T Nguyen

(74) *Attorney, Agent, or Firm* — Ladas & Parry LLP

(57) ABSTRACT

An embodiment of the present disclosure discloses an evaporation method, including: providing a flexible substrate having an original size; stretching the flexible substrate to have an evaporation size, wherein, the evaporation size is greater than the original size; arranging a mask on a side of the flexible substrate having the evaporation size; evaporating a material onto the flexible substrate having the evaporation size by using the mask, to form a patterned film layer.

9 Claims, 4 Drawing Sheets

EVAPORATION METHOD INCLUDING STRETCHING A FLEXIBLE SUBSTRATE

CROSS-REFERENCE TO RELATED PATENT APPLICATION

The present application claims priority of Chinese Patent Application No. 201610461399.8 filed on Jul. 30, 2016, the disclosure of which is incorporated herein by reference in its entirety as part of the present application.

TECHNICAL FIELD

Embodiments of the present disclosure relate to an evaporation method.

BACKGROUND

An evaporation process refers to a process of placing a material for film-forming in a vacuum and evaporating or sublimating to coat it on a substrate in a vacuum environment, which is also called a vacuum evaporation or a vacuum coating.

Generally, when evaporating an organic material, it is necessary to use a high-accuracy metal mask for blocking between the organic material and the substrate, so as to form a patterned film layer by evaporation. Taking an evaporation film layer in a display technical field for example, the high-accuracy metal mask is mainly used for ensuring an accuracy of an evaporation position, determining a fine degree of a pattern formed by evaporation, and determining a number of pixels formed by evaporation. It can be seen that, specific parameters of the high-accuracy metal mask used in the process of evaporation to some extend determines a yield of product.

SUMMARY

An embodiment of the present disclosure provides an evaporation method, comprising: providing a flexible substrate having an original size; stretching the flexible substrate to have an evaporation size, wherein, the evaporation size is greater than the original size; arranging a mask on a side of the flexible substrate having the evaporation size; evaporating a material onto the flexible substrate having the evaporation size by using the mask, to form a patterned film layer.

BRIEF DESCRIPTION OF THE DRAWINGS

In order to illustrate the technical solution in the embodiments of the present disclosure more clearly, the drawings necessary for description of the embodiments shall be briefly explained as follows. Apparently, the drawings in the following description are merely some embodiments of the present disclosure, from which one ordinarily skilled in the art still can obtain other drawings without inventive effort.

DETAILED DESCRIPTION

In order to make the objective, technical solutions, and advantages of the present disclosure clearer, the present disclosure is further described in detail hereinafter in conjunction with the accompanying drawings; and it is obvious that the described embodiments are just part of rather than all of the embodiments of the present disclosure. Based on the described embodiments herein, those ordinarily skilled in the art can obtain other embodiment(s), without any inventive work, which should be within the scope of the present disclosure.

Figure 1:
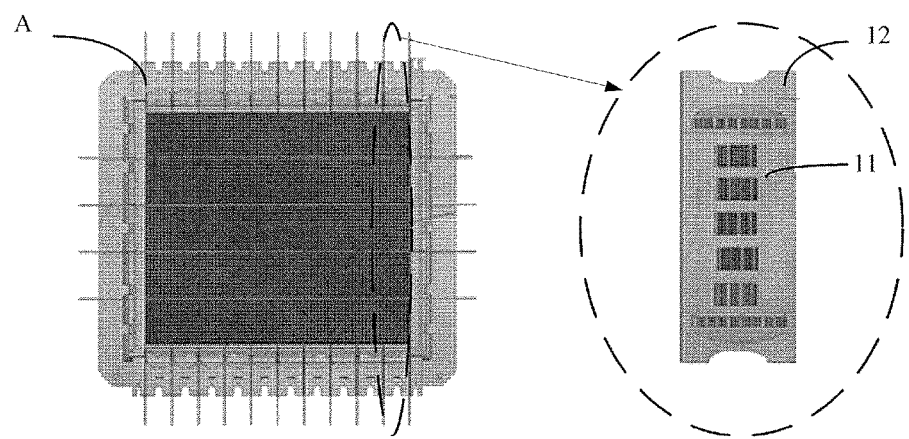
FIG. 1 is a structural schematic diagram of a related high-accuracy metal mask.

It is founded by the inventors that, in order to obtain a high-resolution substrate, it is undesirable to adopt a manner of simply changing a mask precision of a high-accuracy metal mask. As shown in FIG. 1, since a size of a high-accuracy metal mask A is fixed, a minimum value of a mask gap 11 therein is relatively fixed. This is because a normal evaporation process may not be implemented if the gap is too small due to extremely high requirements on evaporation accuracy in a process of evaporation. However, the high-accuracy metal mask used in a related art as shown in FIG. 1 is formed by combining a plurality of high-accuracy metal mask strips 12. Therefore, two adjacent high-accuracy metal mask strips 12 may be easily bonded together by an organic evaporating material in a process of evaporation, resulting in a phenomenon of sticking strips. If a metal mask having higher mask precision (i.e., the numbers of horizontal and vertical opening regions of the mask corresponding to pixel units are higher) is used to achieve a higher resolution, it may cause poor uniformity of the pixel array formed by evaporation, even result in a phenomenon of mixing colors. Thus, a maximum mask precision of the existing high-accuracy metal mask is relatively fixed, but the fixed mask precision may further cause limitation to the number of pixels formed on the respective substrates by evaporation, thereby affecting improvement of a product resolution.

Embodiments of the present disclosure provide an evaporation method, capable of solving the problem that a high-resolution substrate cannot be effectively formed by an evaporation process due to limitation to a mask precision of a high-accuracy metal mask in the related art.

Hereinafter, technical solutions of the embodiments of the present disclosure will be described in detail, and the present disclosure includes but is not limited to the following embodiments.

Figure 2:
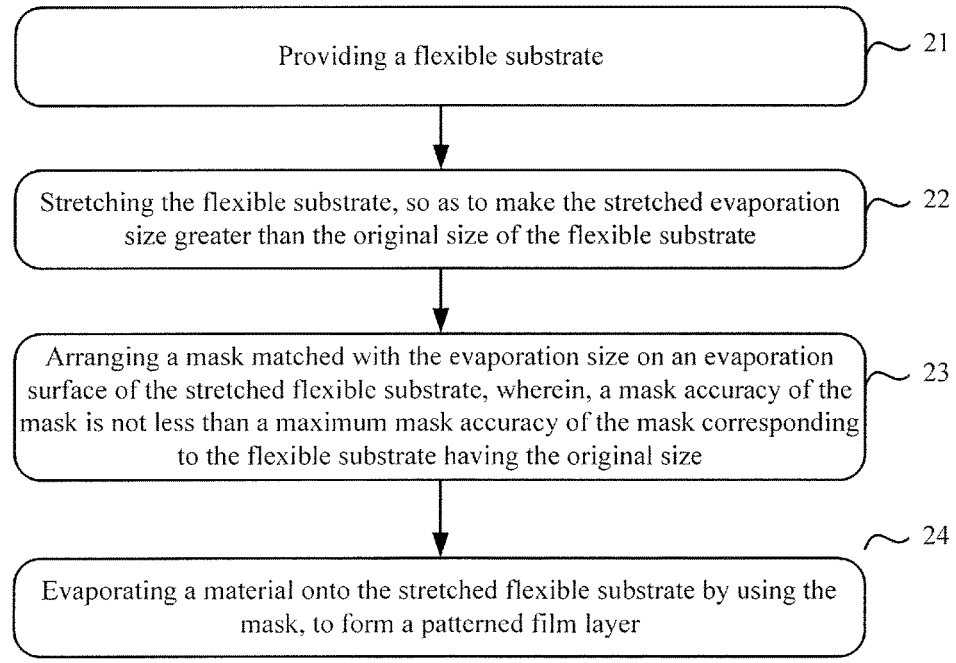
FIG. 2 is a flow schematic diagram of an evaporation method provided by an embodiment of the present disclosure.
Figure 3:
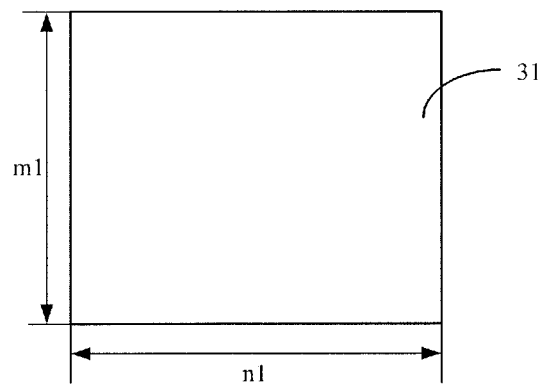
FIG. 3(a) to FIG. 3(d) are process flow schematic diagrams of the evaporation method provided by the embodiment of the present disclosure.
Figure 3:
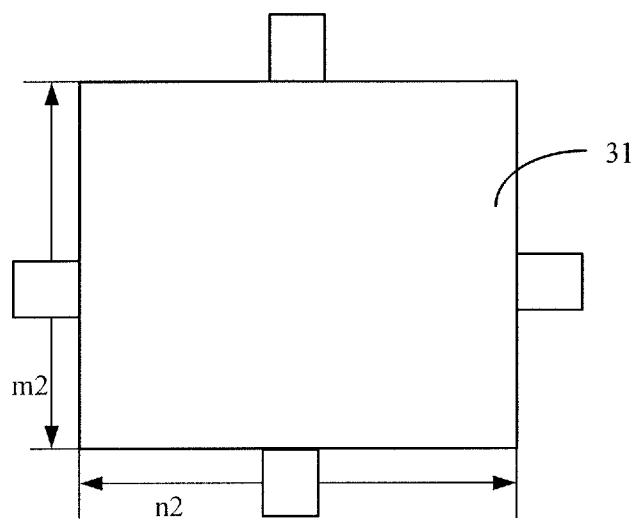
Figure 3:
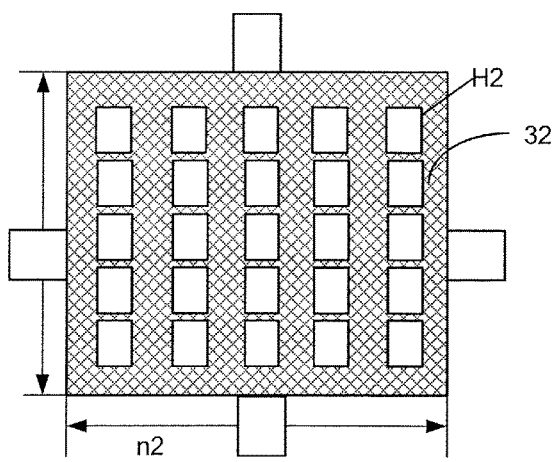
Figure 3:
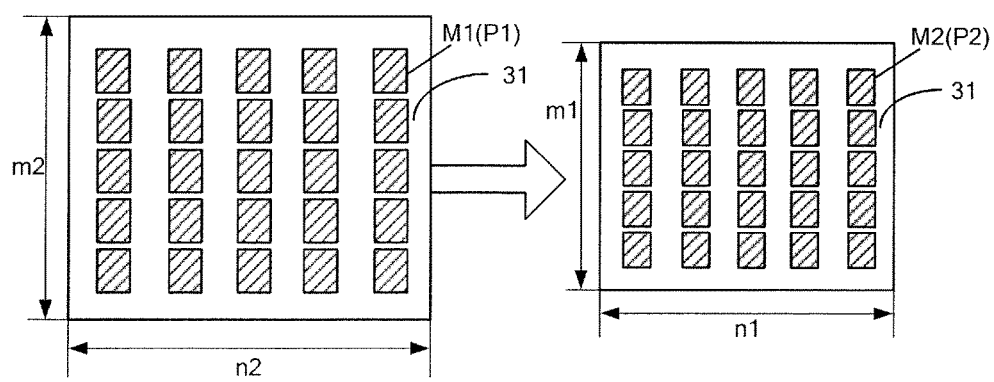

FIG. 2 shows a flow schematic diagram of an evaporation method provided by an embodiment of the present disclosure. The method mainly comprises steps of:

Step 21: providing a flexible substrate having an original size;

Here, the original size of the flexible substrate is an original plane size of the flexible substrate. As shown in FIG. 3(a), there is provided a rectangular flexible substrate 31, assuming that an original size thereof is n1×m1, where n1 denotes a length of the rectangular flexible substrate 31, and m1 denotes a width of the rectangular flexible substrate 31. For example, substrates with respective sizes may correspond to a mask having a same size, and the mask has a fixed maximum mask precision capable of ensuring an effective yield. As to masks having a same size, the smaller the mask pattern arranged periodically therein, the higher the mask precision is, and the larger the mask pattern arranged periodically therein, the lower the mask precision is. In addition, in the embodiment of the present disclosure, for convenience of description, with regard to the masks of different sizes, the greater the number of the mask patterns per unit area (for example, the number of corresponding pixel units arranged in horizontal or vertical directions) is, the higher the mask precision is, and on the contrary, the lower the mask precision is.

Figure 4:
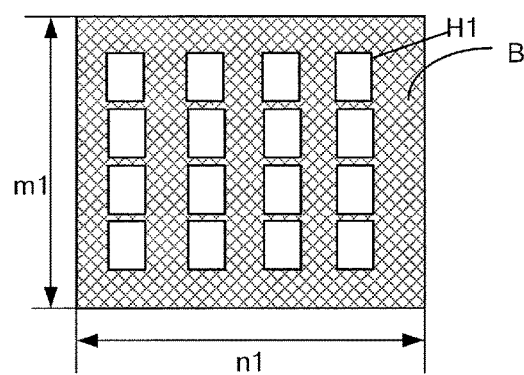
FIG. 4 is a schematic diagram of a mask B having a size of n1×m1.

Accordingly, a mask B having a size of n1×m1 is shown in FIG. 4. The mask B shown in FIG. 4 has a maximum mask precision for ensuring an effective yield, for example, 4×4 pixel unit mask patterns shown in FIG. 4. On one hand, if it is required that more than 4×4 pixel units are formed on the flexible substrate having the size of n1×m1 by evaporating, such requirement can not be met by directly using the mask of the size having the maximum mask precision shown in FIG. 4 to evaporating material onto the flexible substrate having the size of n1×m1. On the other hand, although a resolution may be increased by increasing the mask precision of the mask, the effective yield of pixel units formed on the substrate by evaporation can not be guaranteed.

Step 22: stretching the flexible substrate to have an evaporation size, the evaporation size being greater than the original size;

Here, the evaporation size, for example, is a plane size.

In view of the above issues, the flexible substrate can be stretched because the flexible substrate has flexibility, and there are many stretching methods in practice.

In the embodiment of the present disclosure, a plurality of fixtures are evenly arranged on an edge region of the flexible substrate. A position clamped by each fixture is a set frame region of the substrate. For example, the fixtures can only move in the frame region, but can not exceed the frame region to avoid affecting subsequent evaporation processes for the substrate. For example, the respective fixtures are controlled to stretch the flexible substrate in a same tension.

Figure 5:
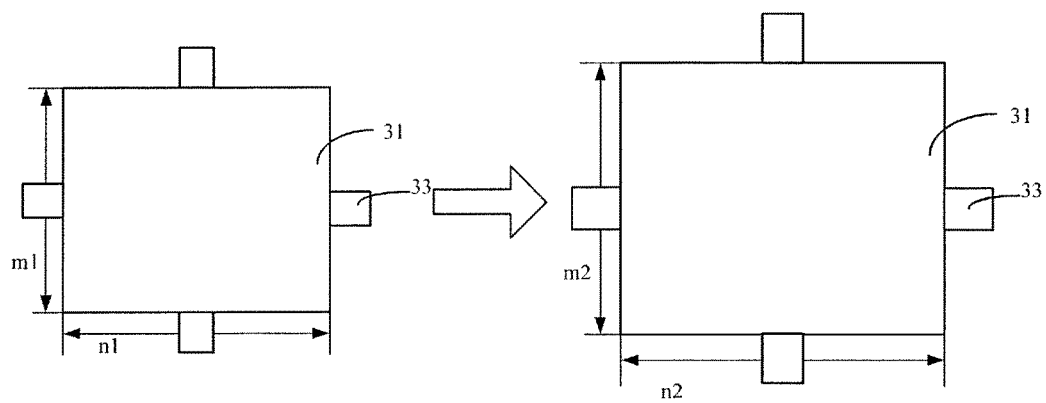
FIG. 5 is a schematic diagram of a flexible substrate provided with fixtures.

For example, the rectangular flexible substrate may be stretched in a manner shown in FIG. 5: four fixture 33 for fixing the flexible substrate are arranged on midpoint positions of four side edges of the rectangular flexible substrate, respectively; and the other sides of the respective fixtures 33 away from the flexible substrate 31 are connected with a controlling stretching device (not shown). When the controlling stretching device is turned on, four side of the flexible substrate are stretched by the fixtures, so as to ensure that the flexible substrate is stretched uniformly in four lateral directions and enlarge the size of the flexible substrate. Wherein, the number of fixtures arranged on each side surface may be determined by an actual size of the flexible substrate; for example, if a size of a side edge is large, the fixtures arranged on this side may be relatively more, and if the size of the side edge is small, the fixtures arranged on this side may be relatively less. Moreover, in a stretching process, pulling forces applied by the respective fixtures are the same in magnitude. For example, the respective fixtures can be controlled by a pulling force detector in the controlling stretching device. For example, the pulling force applied by each fixture 33 is gradually increased from 0 Newton till the size of the flexible substrate is stretched to a desired evaporation size. It should be noted that, the evaporation size obtained by stretching is greater than the original size of the flexible substrate, as shown in FIG. 3(b), the evaporation size of the stretched flexible substrate 31 is n2×m2, where, n2 denotes a length of the rectangular stretched flexible substrate 31, and m2 denotes a width of the rectangular stretched flexible substrate 31, and n2>n1, m2>m1.

In fact, in the evaporation solutions of the embodiments of the present disclosure, a predetermined evaporation size may be defined according to actual needs, and the evaporation size of the stretched flexible substrate equels to the predetermined evaporation size. The predetermined evaporation size is a plane size. In an example, the predetermined evaporation size is less that a maximum tensile size of the flexible substrate. In another example, the evaporation size of the stretched flexible substrate is the maximum tensile size of the flexible substrate. Here, the predetermined evaporation size and the maximum tensile size are all plane sizes.

Step 23: arranging a mask on a side of the flexible substrate having the evaporation size;

For example, a mask matching with the evaporation size is arranged on an evaporation surface of the stretched flexible substrate having the evaporation size. For another example, the mask may be arranged to be not in contact with the flexible substrate.

For example, a mask precision of the mask 32 used in this step is not less than the maximum mask precision of the mask B for ensuring the effective yield corresponding to the flexible substrate 31 having the original size.

For example, as shown in FIG. 3(c), the flexible substrate 31 easily restores to the original size when the stretching is removed. Therefore, before the evaporation is completed, it is necessary to use the fixtures 33 to continuously provide tensile forces for the flexible substrate 31, so as to keep the flexible substrate 31 in a stretched state. No matter the evaporation size of the stretched flexible substrate 31 is a predetermined evaporation size or the maximum tensile size of the flexible substrate 31, a mask 32 having a size same as the current evaporation can match with the stretched flexible substrate 31. For example, the size of the mask 32 is greater than the size of the mask B corresponding to the original size of the flexible substrate 31. Here, the size of the mask B corresponding to the original size of the flexible substrate 31, for example, is the original size of the flexible substrate 31. In order to obtain a flexible substrate having a high resolution, a mask precision of the mask 32 is not less than the maximum mask precision of the mask B for ensuring an effective yield, and meanwhile, the mask precision of the mask 32 is not greater than a maximum mask precision for ensuring an effective yield corresponding to its own size. The mask B as shown in FIG. 4 has the maximum mask precision of 4×4 pixel unit mask patterns H1, for example. If a 5×5 pixel unit array as shown in FIG. 3(d) is it is expected to be formed, the mask 32 has the mask precision of 5×5 pixel unit mask patterns H2 can be arranged on an evaporation surface of the stretched flexible substrate 31. Herein, a size of the pixel unit mask pattern H1 arranged periodically on the mask B, for example, is equal to that of the pixel unit mask pattern H2 arranged periodically on the mask 32.

Step 24: evaporating a material onto the stretched flexible substrate to form a patterned film layer Here, the stretched flexible substrate, for example, has the evaporation size.

A left diagram of FIG. 3(d) is a schematic diagram of a flexible substrate 31 where a patterned film layer M1 is formed by evaporation. For example, the patterned film layer M1 includes a plurality of pixel unit patterns P1 (such as OLED pixel units P1) arranged periodically. Due to a retractility of the flexible substrate 31, after a period of time, the flexible substrate may restore the original size, in a state where the external forces are removed. A right diagram of FIG. 3(d) shows a flexible substrate 31 with the evaporated patterned film layer M2 thereon in a restored original size. For example, the patterned film layer M2 includes a plurality of pixel unit patterns P2 arranged periodically. A plane size of the pixel unit pattern P2, for example, is less than that of the pixel unit pattern P1. In another example, the flexible substrate 31 finally restores to a restored size, and the restored size is greater than the original size of the flexible substrate 31 and less than the evaporation size of the flexible substrate 31.

In the embodiment of the present disclosure, an evaporation size of a flexible substrate is increased by stretching the flexible substrate, and for example, a mask having a same size is matched with the stretched flexible substrate for evaporating; and after the flexible substrate restores the original size, a substrate having a high-resolution is obtained, and the resolution of the flexible substrate is higher than a resolution obtained by a maximum mask precision of a mask corresponding to the original size of the flexible substrate. Since an planar size of the matched mask is enlarged, a corresponding maximum mask precision is increased accordingly and a number of the pixel units formed by evaporation is increased; and meanwhile, since the planar size of the mask is enlarged, a mask gap is enlarged accordingly, thereby avoiding a phenomenon of sticking strips, furthermore, ensuring requirements on evaporation accuracy, and avoiding a phenomenon of mixing colors caused by poor uniformity of evaporation.

It should be noted that, when the flexible substrate restores the original size, an evaporation material is affected by stress; however, because each pixel unit is in micron scale in a OLED technology, the evaporation material can be prevented from falling off or cracking.

By using the above evaporation solutions, without changing the maximum mask precision of a mask, an effect of increasing the resolution of the substrate is achieved by using the flexible feature of the flexible substrate, and meanwhile, the evaporation accuracy is ensured, a technical problem of mixing colors is resolved, and a phenomenon of sticking strips is further avoided.

For example, after step 24 is finished, and the flexible substrate with the evaporated patterned film layer thereon restores an original size, in order to ensure a yield of a next evaporation process, an evaporation rate and an evaporation frequency of an evaporation source for evaporating to form a patterned film layer M2 are adjusted according to detected size parameters of the patterned film layer M2 formed by evaporation, for example, a thickness of the pixel unit pattern P2. For example, the parameters such as width, thickness and actual luminous efficiency, and lifetime and so on of the evaporation material (e.g., the pixel unit pattern P2) on the flexible substrate having the restored original size are detected, and fed back to the evaporation source, to determine evaporation process parameters for adjusting an evaporation rate and an evaporation frequency of the evaporation source in a process of evaporation.

In addition, in the embodiment of the present disclosure, the related mask, for example, is a metal mask.

It is obvious that those skilled in the art can carry out various changes and improvements to the present disclosure without departing from the spirit and scope of the present disclosure. In this case, if such changes and improvements fall into the scope of the claims of the present disclosure and equivalents thereof, the present disclosure intends to contain these changes and improvements therein.

The invention claimed is:

1. An evaporation method, comprising:
   providing a flexible substrate having an original size;
   stretching the flexible substrate to have an evaporation size, wherein, the evaporation size is greater than the original size;
   arranging a mask on a side of the flexible substrate having the evaporation size;
   evaporating a material onto the flexible substrate having the evaporation size by using the mask, the material evaporated forming a patterned film layer, in micron scale, of an organic light emitting diode (OLED) pixel unit;
   restoring the flexible substrate with the patterned film layer formed thereon to have a restored size; and
   adjusting an evaporation rate and an evaporation frequency of an evaporation source for evaporating and forming the patterned film layer, according to a detected parameter of the patterned film layer on the flexible substrate having the restored size.

2. The method according to claim 1, wherein, the mask is arranged on an evaporation surface of the flexible substrate, and matched with the evaporation size of the flexible substrate.

3. The method according to claim 1, wherein, a mask precision of the mask is more than or equal to a maximum mask precision of a mask corresponding to the flexible substrate having the original size.

4. The method according to claim 1, wherein, the stretching the flexible substrate to have an evaporation size includes:
   arranging a plurality of fixtures on an edge region of the flexible substrate having the original size, and controlling the respective fixtures to stretch the flexible substrate in a same tension.

5. The method according to claim 1, wherein, the evaporation size of the flexible substrate is less than a maximum tensile size of the flexible substrate.

6. The method according to claim 1, wherein, the evaporation size of the flexible substrate is a maximum tensile size of the flexible substrate.

7. The method according to claim 1, wherein, the restored size of the flexible substrate is the original size of the flexible substrate.

8. The method according to claim 1, wherein, the detected parameter of the patterned film layer on the flexible substrate having the restored size includes a size parameter.

9. The method according to claim 1, wherein, the mask is a metal mask.

* * * * *